(12) United States Patent
Kato et al.

(10) Patent No.: US 8,330,271 B2
(45) Date of Patent: Dec. 11, 2012

(54) SEMICONDUCTOR ELEMENT, METHOD FOR MANUFACTURING THE SAME, AND MOUNTING STRUCTURE HAVING THE SEMICONDUCTOR ELEMENT MOUNTED THEREON

(75) Inventors: Kenichi Kato, Kirishima (JP); Yoshio Shimoaka, Kirishima (JP)

(73) Assignee: Kyocera Corporation, Kyoto (JP)

( * ) Notice: Subject to any disclaimer, the term of this patent is extended or adjusted under 35 U.S.C. 154(b) by 290 days.

(21) Appl. No.: 12/676,338

(22) PCT Filed: Sep. 2, 2008

(86) PCT No.: PCT/JP2008/065739
§ 371 (c)(1),
(2), (4) Date: Jun. 23, 2010

(87) PCT Pub. No.: WO2009/031522
PCT Pub. Date: Mar. 12, 2009

(65) Prior Publication Data
US 2010/0252926 A1    Oct. 7, 2010

(30) Foreign Application Priority Data
Sep. 4, 2007  (JP) ................. 2007-228486
Oct. 30, 2007  (JP) ................. 2007-281252

(51) Int. Cl.
*H01L 23/488*    (2006.01)
(52) U.S. Cl. ................. 257/737; 257/778; 257/E23.023

(58) Field of Classification Search ................. 257/737, 257/738, 778, 744, 746, 751, 764, E23.023, 257/E23.068
See application file for complete search history.

(56) References Cited

U.S. PATENT DOCUMENTS

| | | | |
|---|---|---|---|
| 6,548,898 B2 * | 4/2003 | Matsuki et al. | ............ 257/746 |
| 7,800,240 B2 * | 9/2010 | Yu | ............ 257/781 |
| 2002/0121709 A1 | 9/2002 | Matsuki et al. | ............ 257/786 |

FOREIGN PATENT DOCUMENTS

| | | |
|---|---|---|
| JP | 2002-203925 | 7/2002 |
| JP | 2004-273959 | 9/2004 |
| JP | 2006-147952 | 6/2006 |

* cited by examiner

*Primary Examiner* — Roy Potter
(74) *Attorney, Agent, or Firm* — DLA Piper LLP (US)

(57) ABSTRACT

A semiconductor element that is excellent in both mechanical reliability and electrical reliability and a mounting structure for the semiconductor element are provided.

The semiconductor element includes: a substrate; an electrically conductive layer on the substrate; a protective layer having an opening on the electrically conductive layer; a barrier metal layer in contact with the electrically conductive layer in the opening; and an electrically conductive bump on the barrier metal layer. The barrier metal layer contains phosphorus and has a phosphorus-rich portion that has a higher phosphorus content than the remaining portion has. The phosphorus-rich portion is located in the surface of the barrier metal layer facing the electrically conductive bump, and the thickness thereof in the periphery of the region where the electrically conductive bump is formed is larger than at the center of the region.

9 Claims, 10 Drawing Sheets

SEMICONDUCTOR ELEMENT, METHOD FOR MANUFACTURING THE SAME, AND MOUNTING STRUCTURE HAVING THE SEMICONDUCTOR ELEMENT MOUNTED THEREON

CROSS-REFERENCE TO THE RELATED APPLICATIONS

This application is a national stage of international application No. PCT/JP2008/065739, filed on Sep. 2, 2008, and claims the benefit of priority under 35 USC 119 to Japanese Patent Application No. 2007-228486, filed on Sep. 4, 2007 and Japanese Patent Application No. 2007-281252, filed on Oct. 30, 2007, the entire contents of all of which are incorporated herein by reference.

TECHNICAL FIELD

The present invention relates to a semiconductor element having an electrically conductive bump such as a solder bump, a method for manufacturing the same, and a mounting structure having the semiconductor element mounted thereon.

BACKGROUND ART

The increasing requirement for high-density mounting in semiconductor packages in recent years has been causing a shift from chip on board (COB) mounting that uses wire bonding technique to flip-chip mounting that uses face-down bonding technique.

Semiconductor chips which are mounted on a circuit board by the flip-chip mounting include one that comprises a semiconductor substrate, electrodes, a passivation layer, a barrier metal layer and solder bump. The electrodes are disposed on the semiconductor substrate. The passivation layer is disposed on the electrodes and has an opening that penetrates therethrough in the thickness direction. The barrier metal layer is located on the electrodes below the opening of the passivation layer, and contains phosphorous (P). The solder bump is formed on the barrier metal layer.

The barrier metal layer of a semiconductor chip that is constituted as described above usually has a phosphorus-rich portion in the surface region on the solder bump side thereof. The phosphorus-rich portion is a region that has a relatively higher phosphorus content. The mechanical strength of the phosphorus-rich portion is lower than that of the other region. This means that an increase in the thickness of the phosphorus-rich portion in the barrier metal layer results in a decrease in mechanical strength of the junction between the solder bump and the barrier metal layer. Thus when thermal stress repetitively acts on the circuit board whereon a semiconductor chip is mounted, for example, there have been such cases as cracks are generated in the junction, and the solder bump eventually peels off. A technology to suppress the thickness of the phosphorus-rich portion as a whole for the purpose of solving this problem is disclosed in Patent Document 1.

Specifically, according to Patent Document 1, a semiconductor chip is manufactured as follows. First, electrode pads are formed on a semiconductor substrate. The electrode pad is formed from an electrically conductive material such as aluminum. Then a passivation film is formed so as to cover a portion that is not covered with the electrode pad in the electrode-pad-forming surface of the semiconductor substrate and also cover a portion surrounding the electrode pad. Then electroless nickel plating is applied to form a nickel layer at a portion that is not covered with the passivation film on the electrode pad, followed by electroless gold plating to form a gold layer on the nickel layer. Then a solder is placed on the gold layer and is heated so as to form solder bump, thereby manufacturing the semiconductor chip having the bump. The nickel layer and the gold layer function as barrier metal layers that provide the base for the solder bump.

Manufacturing the semiconductor chip by the method described in Patent Document 1 makes it possible to suppress the diffusion of nickel that constitutes the nickel layer into the solder bump by means of the gold layer when forming the solder bump. This enables it to improve the reliability by suppressing the formation of a thick intermetallic compound layer, which is relatively brittle, at the interface between nickel and the solder.

Patent Document 1: Japanese Unexamined Patent Publication (Kokai) No. 2004-273959

DISCLOSURE OF THE INVENTION

Problems to be Solved by the Invention

However, reducing the thickness of the phosphorus-rich layer as a whole in the semiconductor chip described above may result in lower corrosion resistance of the semiconductor chip. This is because a region where phosphorus segregation has occurred (phosphorus rich layer) has higher corrosion resistance than other portions of the nickel layer. In particular, in the vicinity of the opening of the passivation film, outside air easily enters through the interface between the passivation layer and the nickel layer, which may cause corrosion.

Under these circumstances, the present invention has been conceived, and an object thereof is to provide a semiconductor element that is excellent in both mechanical reliability and electrical reliability, a method for manufacturing the same, and a mounting structure for the semiconductor element.

Means for Achieving the Object

A first semiconductor element of the present invention has a substrate, an electrically conductive layer, a protective layer, a barrier metal layer, and electrically conductive bump. The electrically conductive layer is provided on the substrate. The protective layer has an opening that is provided on the electrically conductive layer. The barrier metal layer is in contact with the electrically conductive layer in the opening. The electrically conductive bump is formed on the barrier metal layer. The barrier metal layer contains phosphorus and has a phosphorus-rich portion that has a higher phosphorus content than the other portion has. The phosphorus-rich portion is located in the surface region on the electrically-conductive-bump side. The thickness thereof in the periphery of the region where the electrically conductive bump is formed is larger than the thickness at the center of the electrically-conductive-bump forming region.

A second semiconductor element of the present invention has a substrate, an electrically conductive layer, a protective layer, a barrier metal layer, and electrically conductive bump. The electrically conductive layer is provided on the substrate. The protective layer his an opening that is provided on the electrically conductive layer. The barrier metal layer is in contact with the electrically conductive layer in the opening. The electrically conductive bump is formed on the barrier metal layer. The barrier metal layer contains phosphorus and has a phosphorus-rich portion that has a higher phosphorus content than the other portion has. The phosphorus-rich portion is located in the surface region on the electrically-conductive-bump side and only in the periphery of the region where the electrically conductive bump is formed.

The mounting structure of the present invention has the semiconductor element of the present invention and a base member that has connection electrodes. The base member has a pad portion that is electrically connected to the connection electrode. The pad portion is connected to the electrically conductive bump of the semiconductor element of the present invention.

The method for manufacturing a semiconductor element of the present invention comprise an electrically conductive layer forming step, a protective layer forming step, a barrier metal layer forming step, an organic coating forming step, an electrically conductive member placing steps and a bump forming step. In the electrically conductive layer forming step, the electrically conductive layer is formed on the principal surface of the substrate. In the protective layer forming step, the protective layer that covers the electrically conductive layer and has an opening on the electrically conductive layer is formed. In the barrier metal layer forming step, the barrier metal layer that is in contact with the electrically conductive layer in the opening is formed. In the organic coating forming step, an organic coating is formed on the barrier metal layer. In the electrically conductive member placing steps, an electrically conductive member is disposed on the organic coating. The melting point of the electrically conductive member is lower than the vaporization temperature of the organic coating. In the bump forming step, the electrically conductive member is melted and the organic coating is evaporated so as to form the electrically conductive bump on the barrier metal layer.

Effects of the Invention

The semiconductor element of the present invention, the method for manufacturing the same, and the mounting structure enable the improvement of both mechanical reliability and electrical reliability.

DESCRIPTION OF REFERENCE NUMERALS

X1, X2, X3, X1A, X1B, X1C Semiconductor element
Y Mounting structure
P Solder paste (electrically conductive material)
10 Semiconductor substrate (substrate)
20 Electrically conductive layer
30 Passivation layer (protective layer)
30A Opening
40, 41 Barrier metal layer
40A Phosphorus-rich portion
42 First layer (of barrier metal layer 41)
43 Second layer (of barrier metal layer 41)
50 Solder bump (electrically conductive bump)
60 Intermetallic compound layer
70 Organic coating
80 Circuit board
81 Board
82 Circuit pattern
83 Pad portion

BEST MODE FOR CARRYING OUT THE INVENTION

Embodiments of the present invention will be described bellow with reference to the accompanying drawings.
<First Embodiment>

Figure 1A:
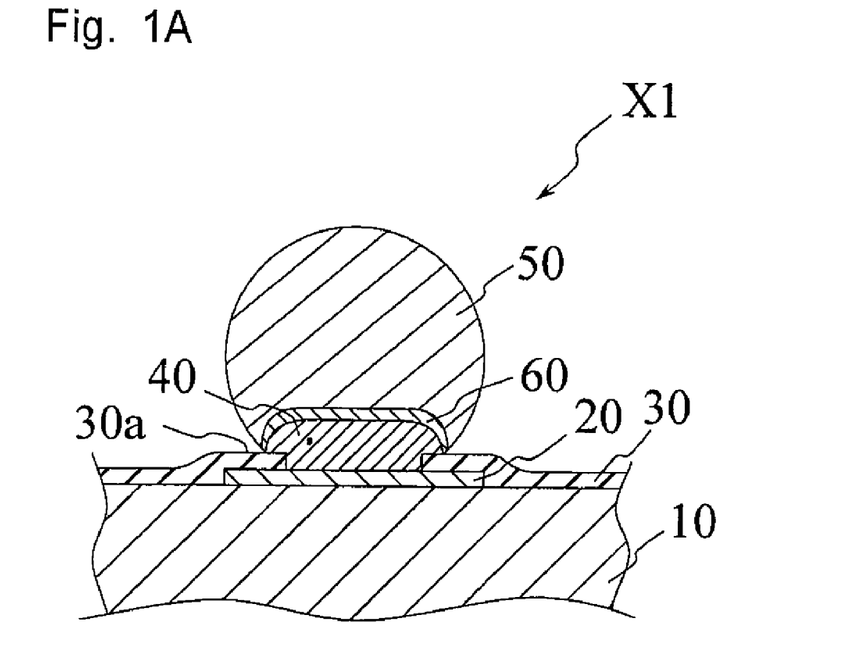
FIG. 1A is a sectional view of a key portion showing the schematic constitution of a semiconductor element according to a first embodiment of the present invention.
Figure 1B:
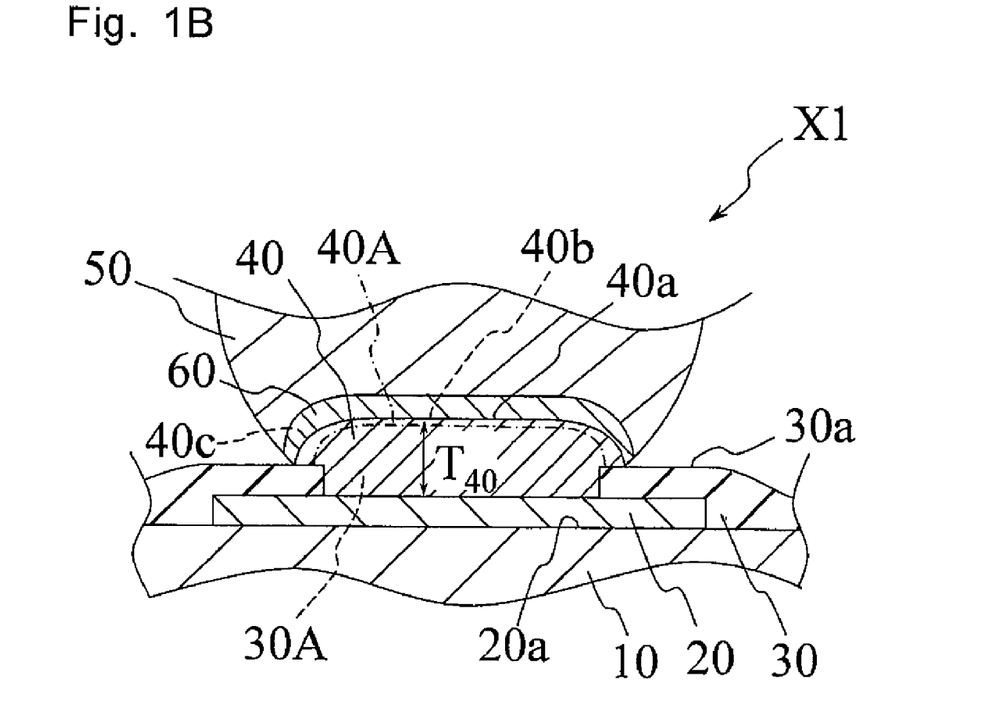
FIG. 1B is an enlarged sectional view of a part of FIG. 1A.
Figure 2:
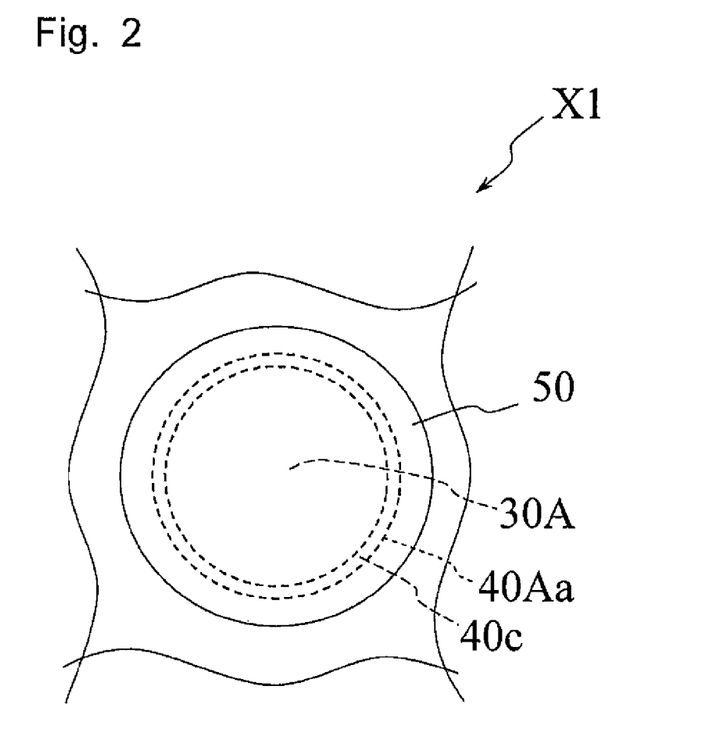
FIG. 2 is a plan view showing the schematic constitution of the semiconductor element shown in FIG. 1A.

FIG. 1A is a sectional view of a key portion showing the schematic constitution of a semiconductor element X1 according to the first embodiment of the present invention, FIG. 1B is an enlarged sectional view of a part of FIG. 1A, and FIG. 2 is a plan view showing the schematic constitution of the semiconductor element X1.

The semiconductor element X1 comprises a semiconductor substrate 10, an electrically conductive layer 20, a passivation layer 30 serving as a protective layer, a barrier metal layer 40, and a solder bump 50.

The semiconductor substrate 10 is formed from a semiconductor material such as silicon (Si). The semiconductor substrate 10 has an integrated circuit (not shown) formed on the surface and in the inside thereof. The semiconductor substrate 10 is not limited to a single-layer structure, and may have a laminated structure consisting of a plurality of layers.

The electrically conductive layer 20 is located above a region 20a of the semiconductor substrate 10. The electrically conductive layer 20 is electrically connected to a wiring pattern that constitutes the integrated circuit of the semiconductor substrate 10. The electrically conductive layer 20 may be formed from a metallic material such as aluminum (Al), copper (Cu), Al—Cu, Al—Si or Al—Si—Cu. The thickness of the electrically conductive layer 20 is set, for example, within a range from 0.2 µm to 2.0 µm.

The passivation layer 30 serves as a protective layer that suppresses corrosion of the semiconductor element X1. The passivation layer 30 is disposed to extend over substantially the entire surface except for an opening 30A that is located on a region 20a where the electrically conductive layer 20 is formed. The opening 30A penetrates through the passivation layer 30 in the thickness direction. The shape of the opening 30A in plan view may be substantially circular for relieving stress relieving, or polygonal having n sides (n is an integer not smaller than 4) in terms of manufacturing cost. The passivation layer 30 is formed from an electrically insulating material such as silicon nitride, silicon oxide, or polyimide. In the first embodiment, the passivation layer 30 is formed to also cover a part (peripheral portion) of the electrically conductive layer 20.

The barrier metal layer 40 is provided on the electrically conductive layer 20. The barrier metal layer 40 is electrically connected to the electrically conductive layer 20 via the opening 30A. The barrier metal layer 40 of the first embodiment has a single-layer structure of nickel (Ni) that contains phosphorus. The barrier metal layer 40 is formed so that the top surface 40a thereof is located at a position higher than the top surface 30a of the passivation layer 30. The barrier metal layer 40 of the first embodiment extends also over the passivation layer 30 along the periphery of the opening 30A. With respect to the top surface 30a of the passivation layer 30, the barrier metal layer 40 has a thickness that increases from the edge toward the center in plan view. The phosphorus content of the barrier metal layer 40 is 5% by weight or higher and less'than 10% by weight (so-called medium phosphorus content nickel). The barrier metal layer 40 of a composition in this range has a hardness in a range from 500 HV to 600 HV in terms of Vickers hardness. Vickers hardness is defined in JIS 22244: 2003 which conforms to ISO standards 6507-1: 1997.

The barrier metal layer 40 of the first embodiment is formed so that, on the surface region thereof on the solder-bump-50 side, a small phosphorus-rich portion 40A (a region where the phosphorus content is 10% by weight or higher) is formed by the diffusion of a part of nickel that constitutes the barrier metal layer 40 to the solder-bump-50 side. The thickness of the phosphorus-rich portion 40A is set so that the thickness at the peripheral portion 40c of the solder-bump-50-forming region (the region where the top surface 40a of the barrier metal layer 40 and the solder bump 50 oppose each other) is larger than the thickness at the central portion 40b of the solder-bump-50-forming region. For example, the phosphorus-rich portion 40A is formed so that a mean thickness at the central portion 40b is in a range from 10 nm to 150 nm and a mean thickness at the peripheral portion 40c is in a range from 300 nm to 800 nm. An edge 40Aa of the phosphorus-rich portion 40A in plan view extends also over the passivation layer 30 on the periphery of the opening 30A. The central portion 40b of the solder-bump-50-forming region may be the top surface 40a of a portion that contains, of the region of the top surface 40a of the barrier metal layer 40 that opposes the solder bump 50, the center of the barrier metal layer 40 in plan view, and has substantially a constant thickness $T_{40}$ of the barrier meal layer 40 with respect to the electrically conductive layer 20. The phrase "substantially constant" means that the thickness $T_{40}$ is in a range from 80% to 120% the mean value of the thickness $T_{40}$ of the barrier metal layer 40 that is located on the inside of the opening 30A of the passivation layer 30 in plan view. The peripheral portion 40c of the solder-bump-50-forming region is, of the region of the top surface 40a of the barrier metal layer 40 that opposes the solder bump 50, the portion located in the vicinity of the inner circumference of the opening 30A of the passivation layer 30 from the edge 40Aa. The peripheral portion 40c may be a region having a width of 2.5 µm or less from the edge 40Aa toward the center of the opening 30A of the passivation layer 30. The phosphorus-rich portion 40A has a phosphorus higher content than the barrier metal layer 40 has, and therefore has higher electrical resistance so that it may be distinguished by the difference in brightness when observed, for example, under a scanning electron microscope (SEM). In order to further improve the resistance to corrosion by the atmosphere, it is preferable that the thickness of the phosphorus-rich portion 40A is set so that the thickness of the portion thereof located on the top surface 30a of the passivation layer 30 is larger than that of a portion located over the opening 30A. According to the present invention, even in the case where the barrier metal layer 40 has a portion that has a phosphorus content higher than that of the remaining portion, there may be such a case as the phosphorus content is less than 10% by weight, whereby the phosphorus-rich portion 40A does not substantially exist or the phosphorus-rich portion 40A partially has a smaller thickness.

In the first embodiment, contents of the constituent elements in the barrier metal layer 40 were measured by the field emission Auger electron spectroscopy (FE-AES). Specifically, samples were prepared by taking a part of the semiconductor substrate 10, a part of the electrically conductive layer 20, a part of the passivation layer 30, a pair of barrier metal layer 40 and the solder bump 50 from the semiconductor element X1. Then a section of the sample was exposed so as to include the center of the solder bump 50 in plan view. The section of the sample was irradiated with an electron beam so as to analyze the surface of the section by the AES method, and the content of each of the constituent elements forming the barrier metal layer 40 was determined. The content of each of the constituent elements forming the barrier metal layer 40 can be determined in this way.

The solder bump 50 is located on the barrier metal layer 40. The solder bump 50 is electrically connected to the barrier metal layer 40. The solder bump 50 is formed so as to cover the entire surface of the barrier metal layer 40. Examples of materials for the solder bump 50 include a Pb-containing solder such as a Pb—Sn (tin) solder, a Pb-free solder that contains any of Sn, Ag, Cu, Bi (bismuth), In (indium), Zn (zinc), Ni, Ge (germanium), Au, and like metals, silver brazing metal, copper brazing metal, phosphor copper brazing metal, bronze brazing metal, aluminum brazing metal and nickel brazing metal, in view of electrical conductivity and tight adhesion with the barrier metal layer 40. Among these materials, for forming the solder bump 50, a Pb-free solder is particularly preferable considering the bonding strength and weatherability. The Pb-free solder is a solder that has a lead content of not higher than 0.10% by weight. This value is specified in JIS standards Z3282:2006 and ISO/TC44/SC12. The size of the solder bump 50 may be, for example, from 25 μm to 85 μm in diameter in plan view.

In the first embodiment, an intermetallic compound layer 60 is provided between the barrier metal layer 40 and the solder bump 50. The intermetallic compound layer 60 is formed by the diffusion of nickel that constitutes the barrier metal layer 40 and the solder that forms the solder bump 50. The thickness of the intermetallic compound layer 60 is set to be sufficiently small to such an extent as proper contact of 4.0 μm or smaller can be ensured, for example. The intermetallic compound layer 60 may be formed from $(Cu, Ni)_6Sn_5$ in the case where nickel containing phosphorus is used for the barrier metal layer 40, and a Pb-free solder that contains copper is used as the solder bump 50.

In this specification, a portion of the top surface 40a of the barrier metal layer 40, which is in contact with the solder bump 50 via the intermetallic compound layer 60, is called the solder-bump-50-forming region. In a preferred embodiment wherein the solder bump 50 covers the entire surface of the barrier metal layer 40, the top surface 40a as a whole serves the solder-bump-50-forming region.

The semiconductor element X1 comprises the semiconductor substrate 10, the electrically conductive layer 20 positioned on the principal surface of the semiconductor substrate 10, the passivation layer 30 that is provided on the electrically conductive layer 20 and has the opening 30A that penetrates through the passivation layer 30 in the thickness direction, the barrier metal layer 40 that is provided to block the opening 30A and is in contact with the electrically conductive layer 20 via the opening 30A, and the solder bump 50 formed on the barrier metal layer 40.

In the first embodiment, in particular, the barrier metal layer 40 is located on the surface region on the solder-bump-50 side, and contains the phosphorus-rich portion 40A that has a higher phosphorus content. In the phosphorus-rich portion 40A, the thickness of the solder-bump-50-forming region in the peripheral portion 40c is larger than that of the solder-bump-50-forming region in the central portion 40b, which achieves the following effect.

In the semiconductor element X1, since the phosphorus-rich portion 40A has a smaller thickness in the central portion 40b into which the outside air is relatively difficult to enter, sufficient mechanical strength can be maintained at the contact interface between the barrier metal layer 40 and the solder bump 50.

further because the phosphorus-rich portion 40A has a greater thickness in the peripheral portion 40c into which the outside air can enter relatively easily, the barrier metal layer 40 (and the electrically conductive layer 20 as well) can be kept sufficiently resistant to corrosion.

As a result, the semiconductor element X1 can be made excellent in both mechanical reliability and electrical reliability.

In the semiconductor element X1, it is preferable that the barrier metal layer 40 is formed to extend also over the passivation layer 30 on the periphery of the opening 30A as shown in FIG. 1A, which enables it to suppress the entry of outside air through the interface between the barrier metal layer 40 and the passivation layer 30, thereby reducing the possibility of corrosion of the barrier metal layer 40 (and the electrically conductive layer 20 as well). Thus in the semiconductor element X1, electrical reliability can be improved further by forming the barrier metal layer 40 to extend also over the passivation layer 30 on the periphery of the opening 30A.

In the semiconductor element X1, it is preferable to form the barrier metal layer 40 by electroless nickel plating, which makes it possible to suppress the diffusion of the electrically conductive material that constitutes the solder bump 50 formed on the barrier metal layer 40 into the electrically conductive layer 20.

A method for manufacturing the semiconductor element X1 of the first embodiment will be described below with reference to FIG. 3A through FIG. 5C. In the first embodiment, aluminum is employed to form the electrically conductive layer 20, an electroless nickel plating layer is used as the barrier metal layer 40, and a solder paste P is used as the electrically conductive member.

<Electrically Conductive Layer Forming Step>

Figure 3A:
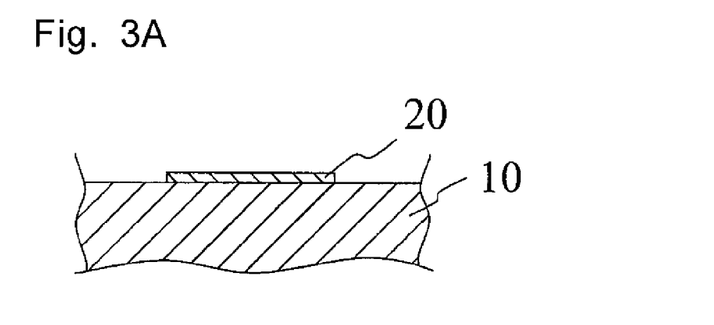
FIG. 3A is a sectional view of a key portion showing one step in the manufacturing process of the semiconductor element shown in FIG. 1A.

According to the method for manufacturing the semiconductor element X1, first, the electrically conductive layer 20 is formed on the semiconductor substrate 10 so as to electrically connect to the wiring pattern (not illustrated) that constitutes the integrated circuit of the semiconductor substrate 10, as shown in FIG. 3A. Specifically, an electrically conductive film is grown by a film growing technology. Then the electrically conductive film is processed into a desired pattern by a micro-machining technology, so as to form the electrically conductive layer 20. As the film growing technology, sputtering or vapor deposition may be employed, for example. As the micro machining technology, photolithography may be used, for example.

<Passivation Layer Forming Step (Protective Layer Forming Step)>

Figure 3B:
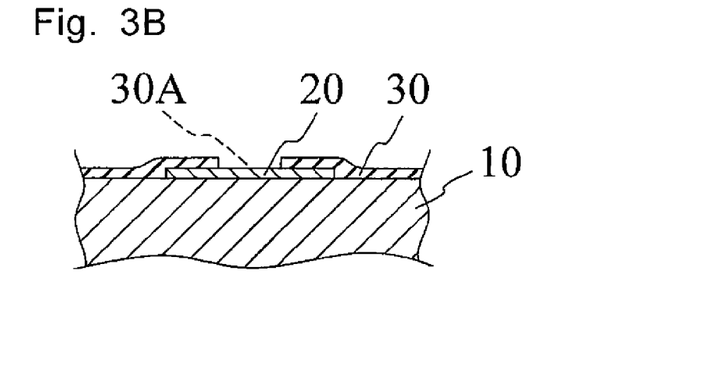
FIG. 3B is a sectional view of a key portion showing a step following that shown in FIG. 3A.

The passivation layer 30 that has the opening 30A which penetrates therethrough in the thickness direction is formed on the semiconductor substrate 10 and on the electrically conductive layer 20, as shown in FIG. 36. Specifically first, the passivation layer 30 is formed so as to cover the entire surfaces of the semiconductor substrate 10 and the electrically conductive layer 20 by the film growing technology. Then the opening 30A is formed in the passivation layer 30 by the micro machining-technology to expose a part of the electrode layer 20, thereby forming the passivation layer 30 that has the opening 30A. As the film growing technology, sputtering or vapor deposition may be employed, for example. As the micro machining technology, photolithography may be used, for example.

<Residue Removing Step>

Figure 3C:
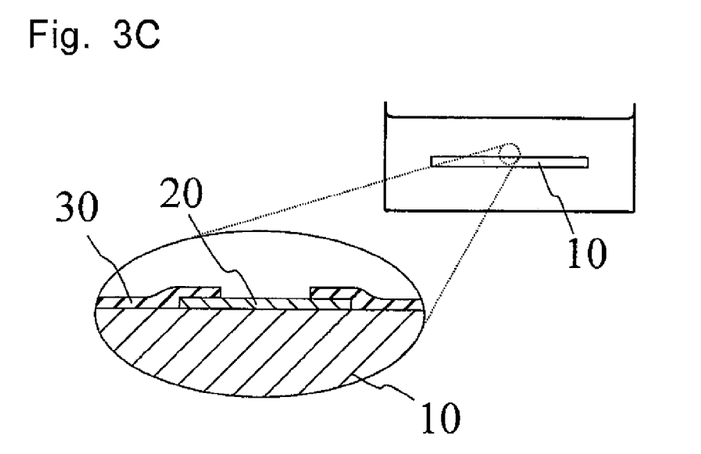
FIG. 3C is a sectional view of a key portion showing a step following that shown in FIG. 3B.

An inorganic residue or organic residue that remains on the semiconductor substrate 10, whereon the electrically conductive layer 20 and the passivation layer 30 have been formed as shown in FIG. 3C, is removed by, for example, wet etching. Specifically, various residues are removed by dipping in an etching solution for a predetermined period of time. As the etching solution to remove inorganic residues, for example, a solution that contains hydrogen fluoride, sulfuric acid, and hydrogen chloride is used. As the etching solution to remove the organic residue, for example, a solution of ethanol, isopropyl alcohol, acetone, or the like may be used. Organic residues may also be removed by, instead of wet etching, $O_2$ asking.

<First Washing Step>

Figure 4A:
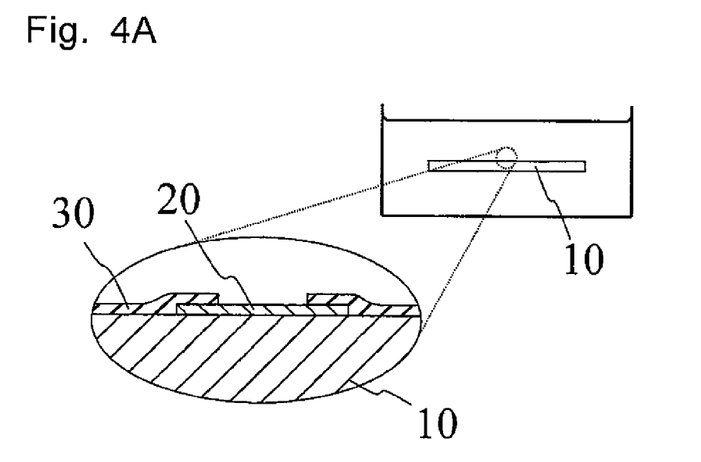
FIG. 4A is a sectional view of a key portion showing a step following that shown in FIG. 3C.

The semiconductor substrate 10 that has passed the residue removing step is washed with water as shown in FIG. 4A. Specifically, the semiconductor substrate 10 that has passed the residue removing step is immersed in washing water.

<Zincate Treatment Step>

Figure 4B:
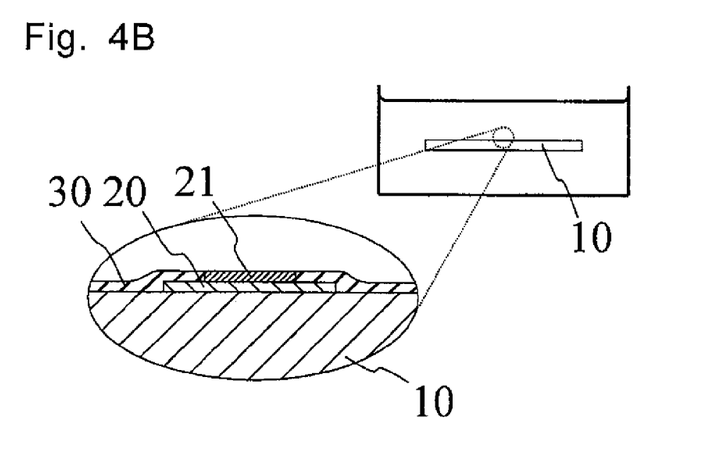
FIG. 4B is a sectional view of a key portion showing a step following that shown in FIG. 4A.

The semiconductor substrate 10 that has passed the washing step is subjected to a zincate treatment as shown in FIG. 4B. Specifically, the semiconductor substrate 10 that has passed the first washing step is dipped in a zincate treatment solution for a predetermined period of time. The zincate treatment solution contains zinc, so that aluminum of the electrically conductive layer 20 in the opening 30A is substituted by zinc, followed by the deposition of zinc, thereby forming a zinc film 21 on the surface of the electrically conductive layer 20. The zincate treatment may be repeated till the zinc film 21 grows to a predetermined thickness.

<Barrier Metal Layer Forming Step>

Figure 4C:
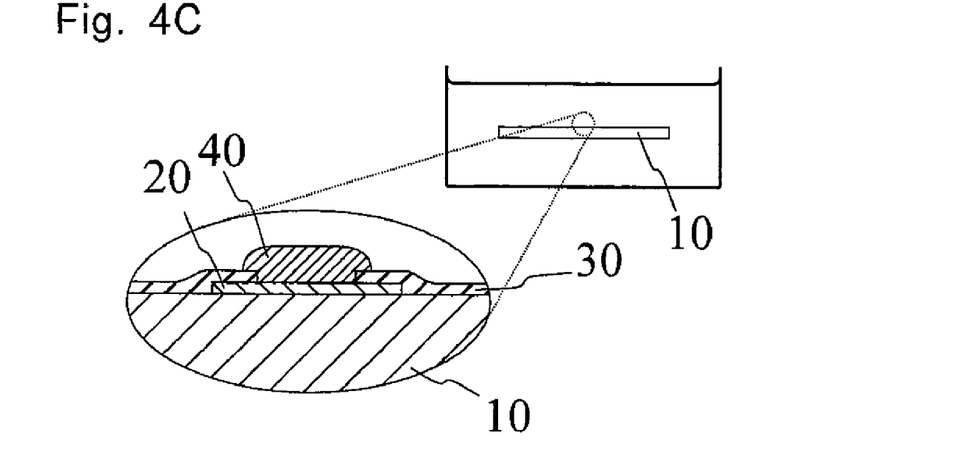
FIG. 4C is a sectional view of a key portion showing a step following that shown in FIG. 4B.

An electroless nickel plating layer is formed as the barrier metal layer 40 on the electrically conductive layer 20 of the semiconductor substrate 10 that has been subjected to the zincate treatment as shown in FIG. 4C. Specifically, the semiconductor substrate 10 that has been subjected to the zincate treatment is dipped in an electroless nickel plating solution for a predetermined period of time. In the electroless nickel plating solution, zinc of the zinc film 21 formed on the surface of the electrically conductive layer 20 is substituted by nickel contained in the electroless nickel plating solution, followed the deposition of zinc, thereby forming an electroless nickel plating layer (the barrier metal layer 40) on the surface of the electrically conductive layer 20. As the electroless nickel plating solution, a solution that contains sodium hypophosphite or the like as a reducing agent and also contains nickel sulfate, nickel chloride, or the like as a nickel salt may be used. In order to reduce the influence on the semiconductor, the electroless nickel plating solution preferably contains nickel sulfate as the nickel salt. In order to apply the electroless nickel plating efficiently, hydrogen ion exponent (pH) of the electroless nickel plating solution is preferably controlled to not lower than 4 and not higher than 5 by means of a pH adjuster such as ammonia.

<Second Washing Step>

The semiconductor substrate 10 that has passed the barrier metal layer forming step is washed with water in the same manner as in the first washing step. Specifically, the semiconductor substrate 10 that has passed the barrier metal layer forming step is immersed in washing water.

<Organic Coating Forming Step>

Figure 5A:
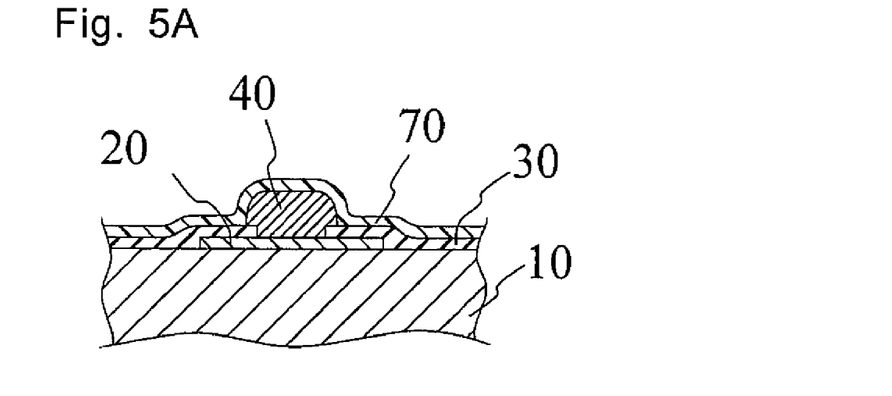
FIG. 5A is a sectional view of a key portion showing a step following that shown in FIG. 4C.

An organic coating 70 is formed on the electroless nickel plating layer of the semiconductor substrate 10 that has the electroless nickel plating layer (barrier metal layer 40) formed thereon as shown in FIG. 5A. Specifically, first, the semiconductor substrate 10 that has the electroless nickel plating layer (barrier metal layer 40) formed thereon is dipped in an organic solution for a predetermined period of time. The barrier metal layer 40 coated with the organic solution deposited thereon is subjected to drying so as to form the organic coating 70. As the organic solution, for example, a solution containing pure water, an alicyclic acid, and an aliphatic amine derivative may be used. In the first embodiment, the organic solution is controlled to have a vaporization temperature in a range from 200° C. to 240° C. The vaporization temperature of the organic coatin film 70 can be measured using a differential scanning calorimeter (manufactured by Seiko Instrument, Model DSC-6200) at temperature-rising a rate of 10° C./min in an air atmosphere.

<Electrically Conductive Member Placing Steps>

Figure 5B:
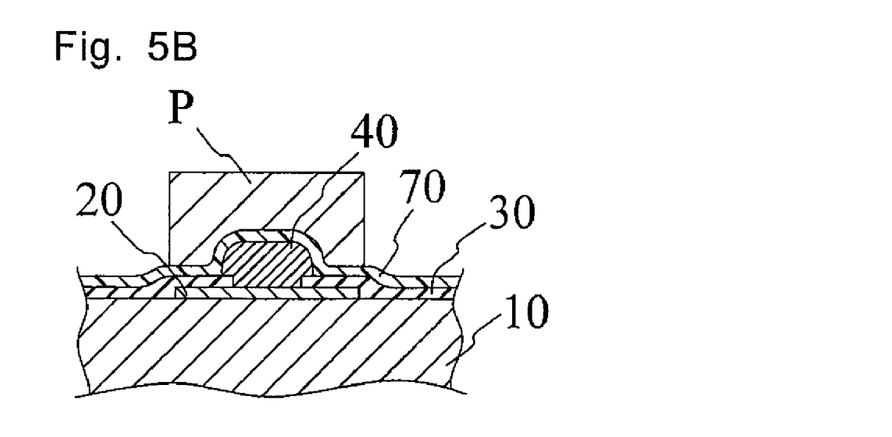
FIG. 5B is a sectional view of a key portion showing a step following that shown in FIG. 5A.

A solder paste P is placed (or applied) as an electrically conductive member on the organic coating 50 of the semiconductor substrate 10 that has passed the organic coating forming step as shown in FIG. 5B. Specifically, the solder paste P is provided by screen printing or the like on the organic coating 50 that is disposed on the barrier metal layer 40 of the semiconductor substrate 10 that has passed the organic coating forming step. As the solder paste P, one that has a melting point lower than the vaporization temperature of the organic coating 70 is used. The melting point of the solder paste P is set to be lower than the vaporization temperature of the organic coating 70 within a range of, for example, from 160° C. to 230° C. As the solder paste P, a Pb-free solder such as Sn/3.0Ag/0.5Cu is preferable in terms of weatherability. As the melting point of the solder paste P, a solidus temperature value is used.

<Bump Forming Step>

Figure 5C:
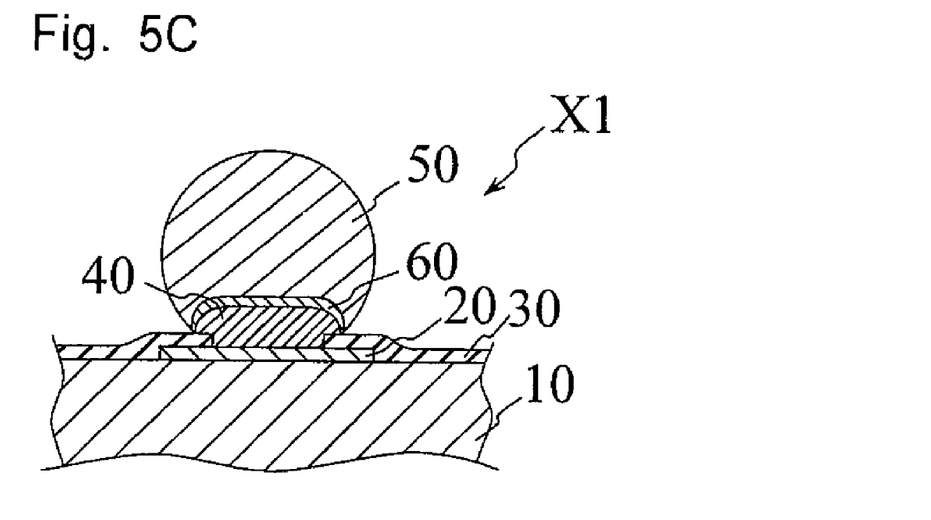
FIG. 5C is a sectional view of a key portion showing a step following that shown in FIG. 5B.

The semiconductor substrate 10 that has passed the electrically conductive member placing steps is heated at a predetermined temperature so as to form the solder bump 50 on the barrier metal layer 40, as shown in FIG. 5C. Specifically, first, the semiconductor substrate 10 that has the solder paste P applied thereto is put into a reflow furnace equipped with a heater, and is heated by the heater. In the reflow furnace, heating is performed at a temperature not lower than 245° C., for example, for a period of time required to completely vaporize the organic coating 70, for example. The solder bump 50 of substantially spherical shape is thus formed.

According to the method for manufacturing the semiconductor element X1, the organic coating 50 formed on the central portion 40b of the barrier metal layer 40 is surrounded by the barrier metal layer' 40 and the solder paste P. Therefore, evaporation takes a longer period of time as compared with the case of the organic coating 50 that is formed on the peripheral portion 40c located near the outside atmosphere. Thus, according to the method for manufacturing the semiconductor element X1, the diffusion of the metal such as Ni that constitutes the barrier metal layer 40 into the solder bump 50 can be reduced in the central portion 40b than in the peripheral portion 40c, thereby allowing the thickness of the phosphorus-rich portion 40A to be smaller in the central portion 40b than in the peripheral portion 40c. As a result, the method for manufacturing the semiconductor, element X1 makes it possible to set the thickness of the phosphorus-rich portion 40A smaller in the central portion 40b, also set the thickness of the phosphorus-rich portion 40A larger in the peripheral portion 40c than in the central portion 40b.

The manufacturing method of the first embodiment makes it possible to reduce the possibility of the relatively brittle intermetallic compound layer 60 (such as $(Cu, Ni)_6Sn_5$) being formed excessively thick at the interface between the barrier metal layer 40 and the solder bump 50. This further improves the reliability of the semiconductor element X1 that is manufactured.

<Second Embodiment>

Figure 6A:
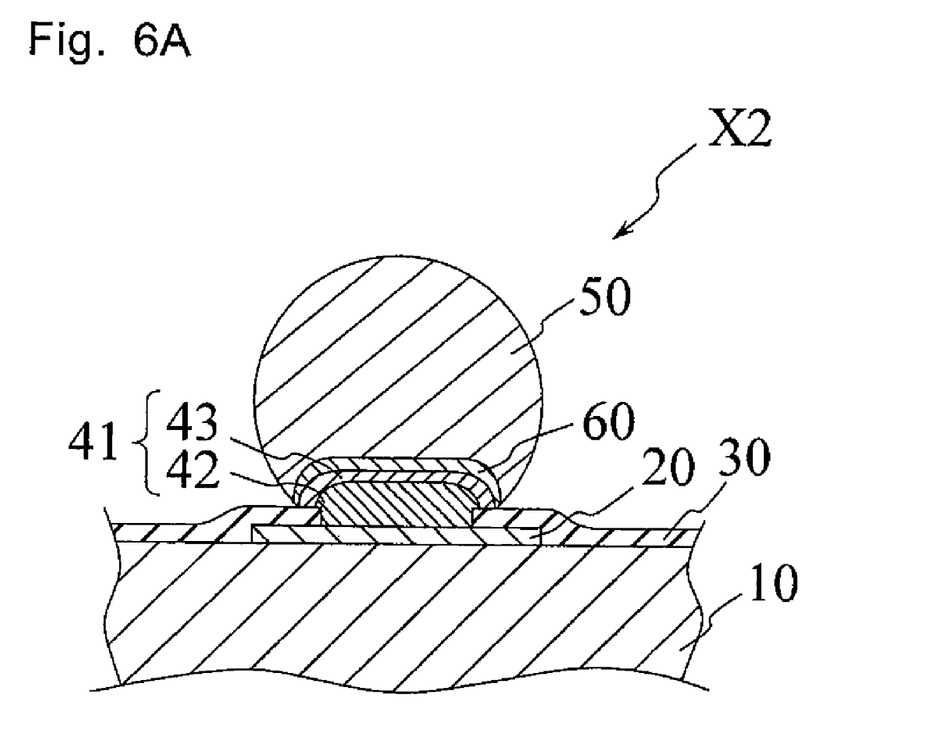
FIG. 6A is a sectional view of a key portion showing the schematic constitution of a semiconductor element according to a second embodiment of the present invention.
Figure 6B:
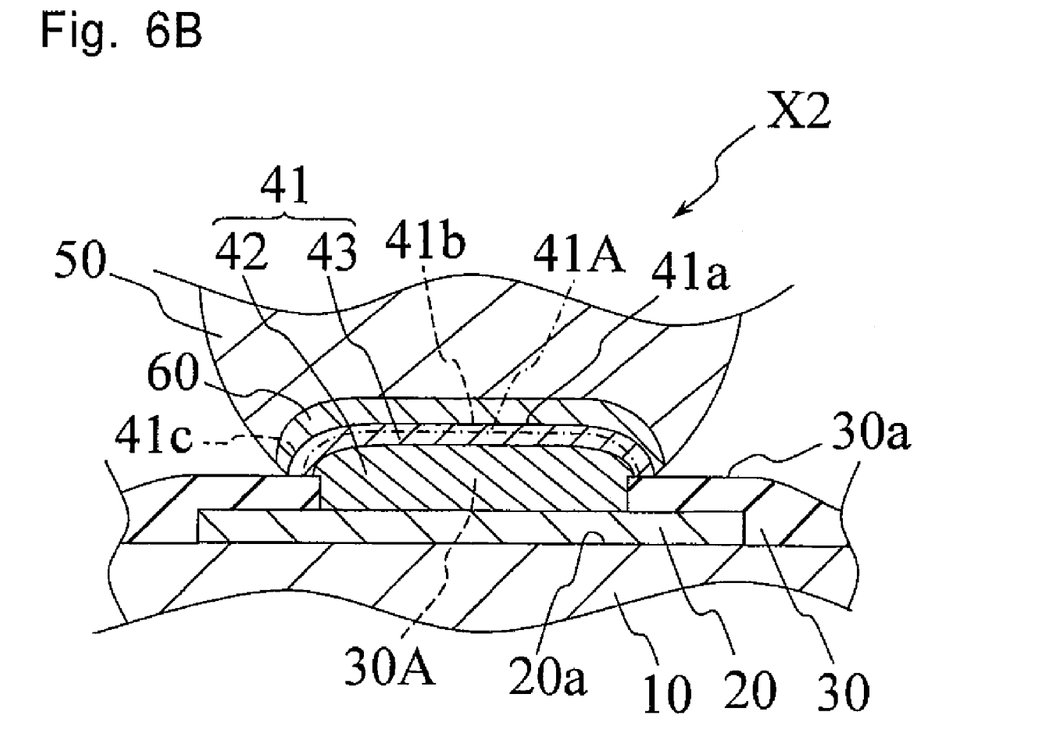
FIG. 6B is an enlarged sectional view of a part of FIG. 6A.

FIG. 6A is a sectional view of a key portion showing the schematic constitution of a semiconductor element X2 according to the second embodiment of the present invention. FIG. 6B is an enlarged sectional view of a part of FIG. 6A.

The semiconductor element X2 is different from the semiconductor element X1 in that a barrier metal layer 41 is provided instead of the barrier metal layer 40 of the semiconductor element X1. In other respects, the constitution of the semiconductor element X2 is the same as that of the semiconductor element X1 described above.

The barrier metal layer 41 is formed on the electrically conductive layer 20 in the opening 30A of the passivation layer 30. The barrier metal layer 41 is electrically connected to the electrically conductive layer 20. The barrier metal layer 41 of the second embodiment has a laminated structure consisting of a first layer 42 formed from nickel that contains phosphorus with a first phosphorus content and a second layer 43 that contains phosphorus with a second phosphorus content. The second phosphorus content is lower than the first phosphorus content. The barrier metal layer 41 is formed so that the uppermost surface 41a thereof is located at a position higher than the top surface 30a of the passivation layer 30. The first phosphorus content is preferably lower than 10% by weight.

The first layer 42 and the second layer 43 of the barrier metal layer 41 according to the second embodiment are preferably formed to extend also over the passivation layer 30 on the periphery of the opening 30A. The phosphorus content of the first layer 42 (so-called first phosphorus content) of the barrier metal layer 41 is set to 5% by weight or higher and less than 10% by weight (medium phosphorus content nickel). The first layer 42 of the barrier metal layer 41 having a composition in this range has a hardness, for example, in a range from 500 HV to 600 HV in terms of Vickers hardness. The phosphorus content of the second layer 43 (second phosphorus content) of the barrier metal layer 41 is 1% by weight or higher and less than 5% by weight (so-called low phosphorus content nickel). The second layer 43 of the barrier metal layer 41 having a composition in this range has a hardness, for example, in a range from 700 HV to 1,000 HV in terms of Vickers hardness.

The barrier metal layer 41 of the second embodiment is formed so that, on the surface region thereof the solder-bump-50 side, a small phosphorus-rich portion 41A (a region where the phosphorus content is 10% by weight or higher) is formed by the diffusion of a part of nickel that constitutes the barrier metal layer 41 to the solder-bump-50 side.

In the semiconductor element X2 of the second embodiment, the barrier metal layer 41 has the first layer 42 and the second layer 43 where the phosphorus content is lower than that of the phosphorus-rich portion 41A. The first layer 42 has a phosphorus content higher than that of the second layer 43. In the opening 30A of the passivation layer 30, the first layer 42 is also located nearer to the electrically conductive layer 20 than is the second layer 43. When the phosphorus content of the first layer 42 that is located nearer to the electrically conductive layer 20 is higher than that of the second layer 43 in this way, the corrosion resistance of the barrier metal layer 41 in the semiconductor element X2 can be further reduced. Also, in the semiconductor element X2, it is made possible to suppress an excessive increase in the hardness of the barrier metal layer 41 due to an excessive decrease in the phosphorus content, thereby suppressing cracking and chipping in the passivation layer 30. Thus the semiconductor element X2 is advantageous in improving mechanical reliability and electrical reliability. This constitution is also advantageous in suppressing an increase in the thickness of the phosphorus-rich portion 41A.

In the semiconductor element X2 shown in FIG. 6A and other drawings, since the first layer 42 of the barrier metal layer 41 is formed also on the passivation layer 30A in the periphery of the opening 30A, it is possible to sufficiently suppress a decrease in the corrosion resistance of the peripheral portion 41c of the solder-bump-50-forming region.

The method for manufacturing the semiconductor element X2 of the second embodiment will be described below with reference to FIG. 7A and FIG. 7B. The method for manufacturing the semiconductor element X2 is different from the method for manufacturing the semiconductor element X1 in the barrier metal layer forming step where the barrier metal layer 41 of the semiconductor element X2 is formed. In other steps, the method for manufacturing the semiconductor element X2 is same as the method for manufacturing the semiconductor element X1 described above.

<Barrier Metal Layer Forming Step>

Figure 7A:
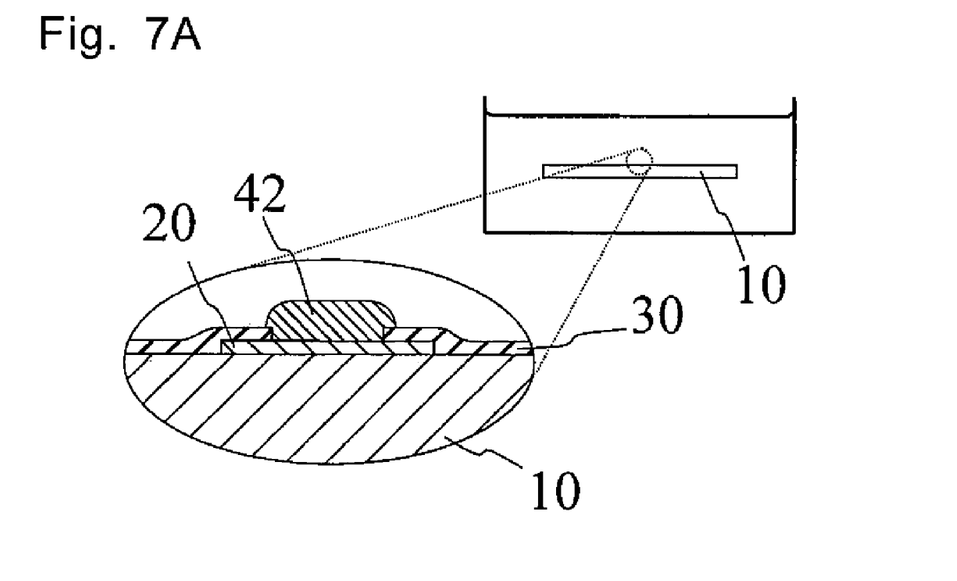
FIG. 7A is a sectional view of a key portion showing one step in the manufacturing process of the semiconductor element shown in FIG. 6A.

First, the electroless nickel plating layer is formed as the first layer 42 of the barrier metal layer 41 on the electrically conductive layer 20 of the semiconductor substrate 10 that has passed the zincate treatment as shown in FIG. 7A. Specifically, first, the semiconductor substrate 10 that has been subject to the zincate treatment is dipped in a first electroless nickel plating solution for a predetermined period of time. In the electroless nickel plating solution, zinc of the zinc film formed on the surface of the electrically conductive layer 20 is substituted by nickel contained in the electroless nickel plating solution, followed by the deposition of nickel, thereby forming an electroless nickel plating layer (the first layer 42 of the barrier metal layer 41) on the electrically conductive layer 20. As the first electroless nickel plating solution, a solution that contains sodium hypophosphite or the like as a reducing agent and nickel sulfate, nickel chloride, or the like as a nickel salt may be used. In order to reduce the influence on the semiconductor, the electroless nickel plating solution preferably contains nickel sulfate as the nickel salt. In order to apply electroless nickel plating efficiently Hydrogen ion exponent (pH) of the first electroless nickel plating solution is preferably controlled to not lower than 4 and not higher than 5 by means of a pH adjuster such as ammonia.

Figure 7B:
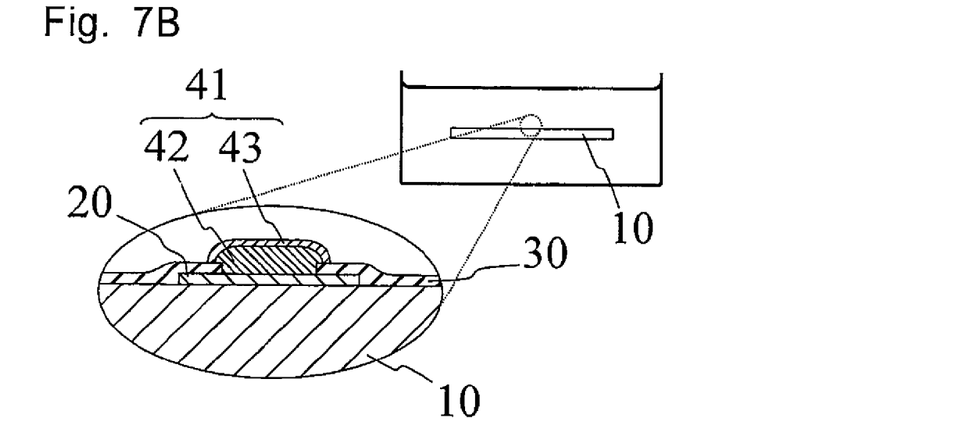
FIG. 7B is a sectional view of a key portion showing a step following that shown in FIG. 7A.

Then the electroless nickel plating layer is formed as the second layer 43 on the first layer 42 as shown in FIG. 7B. Specifically, the process the same as the formation of the first layer 42 of the barrier metal layer 41 described above, except for using a second electroless nickel plating solution instead of the first electroless nickel plating solution. For the second electroless nickel plating solution, a solution that contains sodium hypophosphite or the like as a reducing agent and nickel sulfate, nickel chloride, or the like as a nickel salt may be used. In order to reduce the influence on the semiconductor, the electroless nickel plating solution preferably contains nickel sulfate as the nickel salt. Unlike the first electroless nickel plating solution, the second electroless nickel plating solution is prepared so that the proportion of phosphorus that precipitates becomes lower. In order to apply the electroless nickel plating efficiently the value of pH of the second electroless nickel plating solution is preferably controlled within a range from 6 to 7 by means of a pH adjuster such as ammonia.

The method for manufacturing the semiconductor element X2 achieves similar effects to those achieved by the method for manufacturing the semiconductor element X1.

<Third Embodiment>

Figure 8:
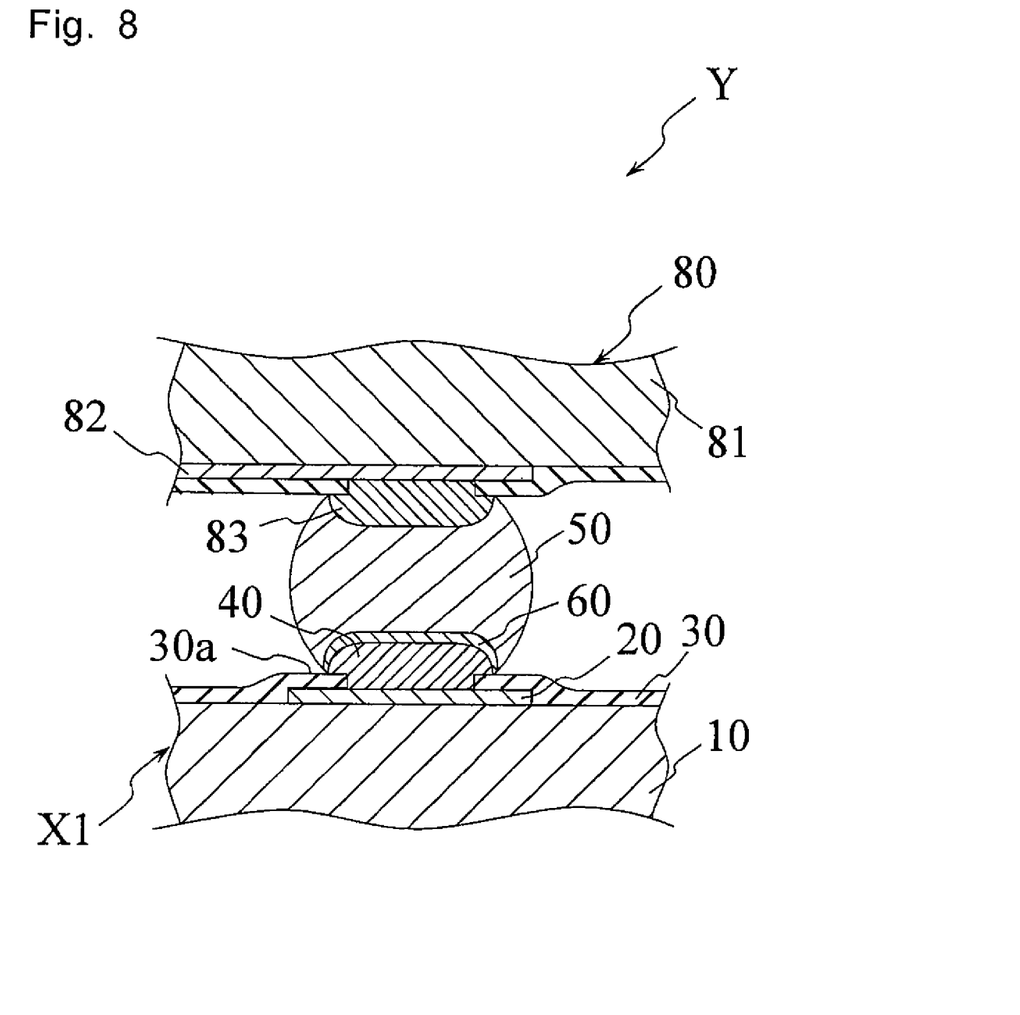
FIG. 8 is a sectional view of a key portion showing the schematic constitution of a mounting structure according to a third embodiment of the present invention.

FIG. 8 is a sectional view of a key portion showing the schematic constitution of a mounting structure Y according to the third embodiment of the present invention.

The mounting structure Y of the third embodiment is a circuit board 80 having the semiconductor element X1 of the first embodiment mounted thereon. The mounting structure Y comprises the semiconductor element X1 and the circuit board 80. While the third embodiment will be described for a case where the semiconductor element X1 is used, the semiconductor element X1 may be replaced with the semiconductor element X2.

The circuit board 80 comprises a board 81, a circuit pattern 82, a pad portion 83, and a functional element (not illustrated).

The board 81 serves as a support base for the circuit pattern 82 and the pad portion 83.

The circuit pattern 82 is electrically connected to the functional element that is riot illustrated, and is formed on the board 81. The circuit pattern 82 is formed from a metallic material such as Al, Cu, Al—Cu, Al—Si, or Al—Si—Cu.

The pad portion 83 serves the function of providing an electrical connection to the electrically conductive layer 20 of the semiconductor element X1. The pad portion 83 is electrically connected to the circuit pattern 82. The semiconductor element X1 is mounted on the pad portion 83 via the solder bump 60.

The mounting structure Y has the semiconductor element X1 mounted thereon, and is therefore capable of achieving the effects of the semiconductor element X1. Therefore, the mounting structure can be provided with excellent mechanical reliability and electrical reliability.

First through third specific embodiments of the present invention have been described, but the present invention is not limited to these embodiments, and various modifications can be made without departing from the idea of the present invention.

Figure 9A:
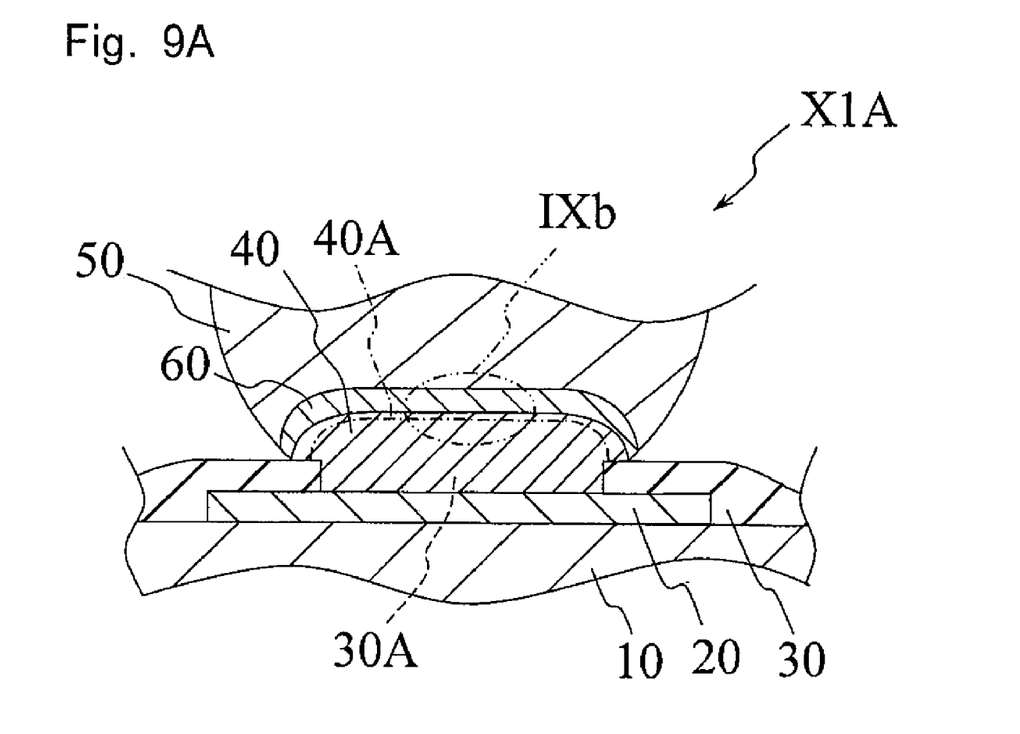
FIG. 9A is a sectional view of a key portion showing a variation of the semiconductor element according to the first embodiment of the present invention.
Figure 9B:
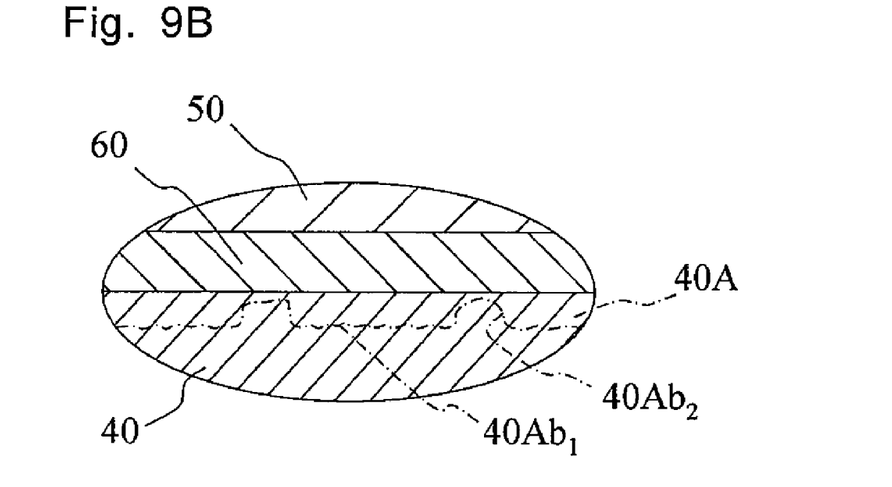
FIG. 9B is an enlarged sectional view of a part of FIG. 9A.

In the semiconductor element X1 according to the first embodiment of the present invention, the phosphorus-rich portion 40A of the barrier metal layer 40 has a substantially uniform thickness in the central portion 40b. The structure of the semiconductor element X1 of the present invention is not limited thereto. For example, the phosphorus-rich portion 40A of the barrier metal layer 40 may have, in the central portion 40b, a first portion $40Ab_1$ having a predetermined thickness and a second portion $40Ab_2$ having a thickness smaller than that of the first portion $40Ab_1$ as shown in FIG. 9A and FIG. 9B.

Figure 10A:
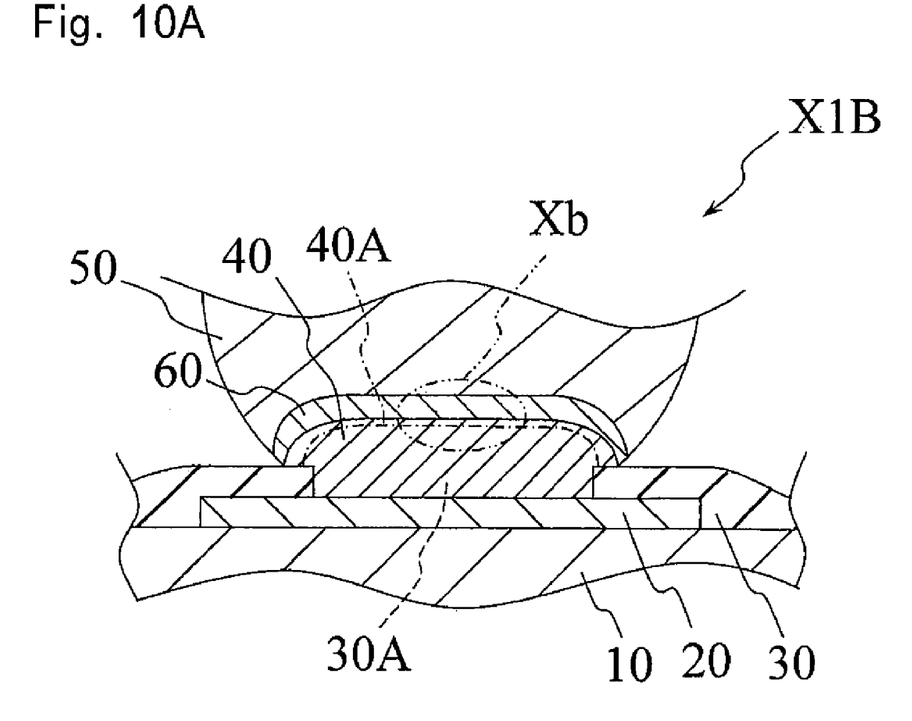
FIG. 10A is a sectional view of a key portion showing another variation of the semiconductor element according to the first embodiment of the present invention.
Figure 10B:
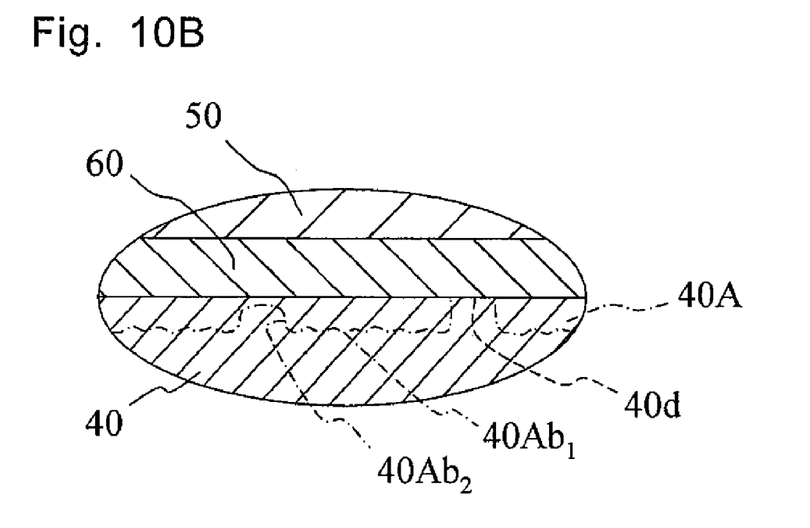
FIG. 10B is an enlarged sectional view of a part of FIG. 10A.

A portion other than the phosphorus-rich portion 40A of the barrier metal layer 30 may penetrate through the phosphorus-rich portion 40A and be in contact with the intermetallic compound layer 60 as shown in FIG. 10A and FIG. 10B. In this case, mechanical strength of the contact interface between the barrier metal layer 40 and the solder bump 50 can be further increased in this region 40d, and therefore the mechanical reliability can be higher.

Figure 11:
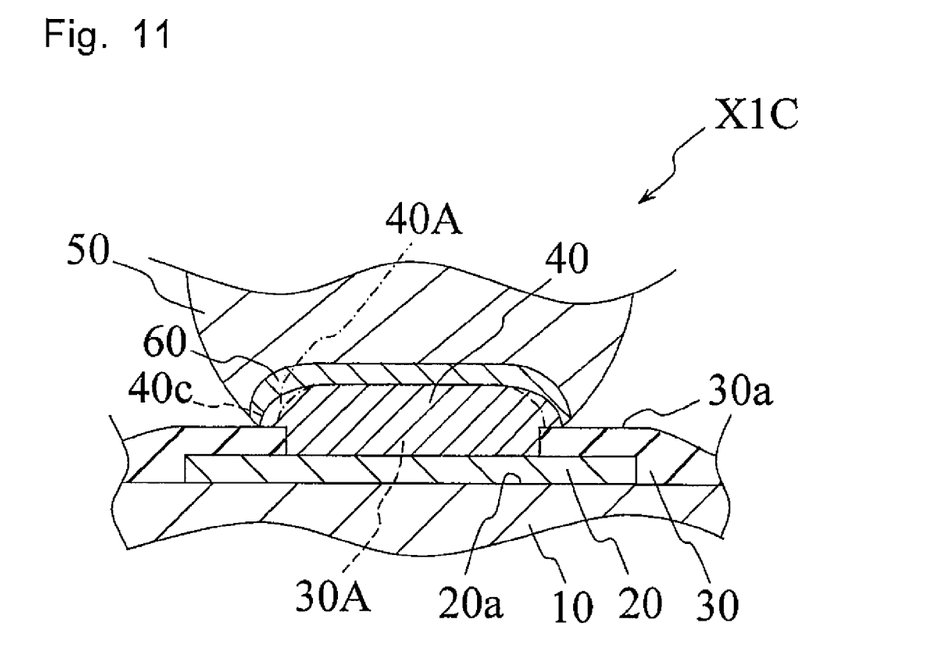
FIG. 11 is an enlarged sectional view of a key portion showing further another variation of the semiconductor element according to the first embodiment of the present invention.

In the semiconductor element X1 according to the first embodiment of the present invention, the phosphorus-rich portion 40A is formed on the solder-bump-50 side of the barrier metal layer 40. The structure of semiconductor element X1 of the present invention is not limited thereto, and the phosphorus-rich portion 40A may be positioned only on the peripheral portion 40c as shown in FIG. 11. Even in this case, effects similar to those of the semiconductor element X1 can be achieved. In addition, mechanical strength can be further increased at the contact interface between the barrier metal layer 40 and the solder bump 60, because the phosphorus-rich portion 40A is not provided in the central portion 40b.

In the first through third embodiments, the semiconductor elements having the phosphorus-rich portion have been described.

However, the manufacturing method described in the first embodiment may also be applied to the manufacture of the semiconductor element which does not have the phosphorus-rich portion in the barrier metal layer 40, in which case a thickness of the intermetallic compound layer 60 can be smaller.

the detail thereof will be described below as the fourth embodiment.

<Fourth Embodiment>

Figure 12:
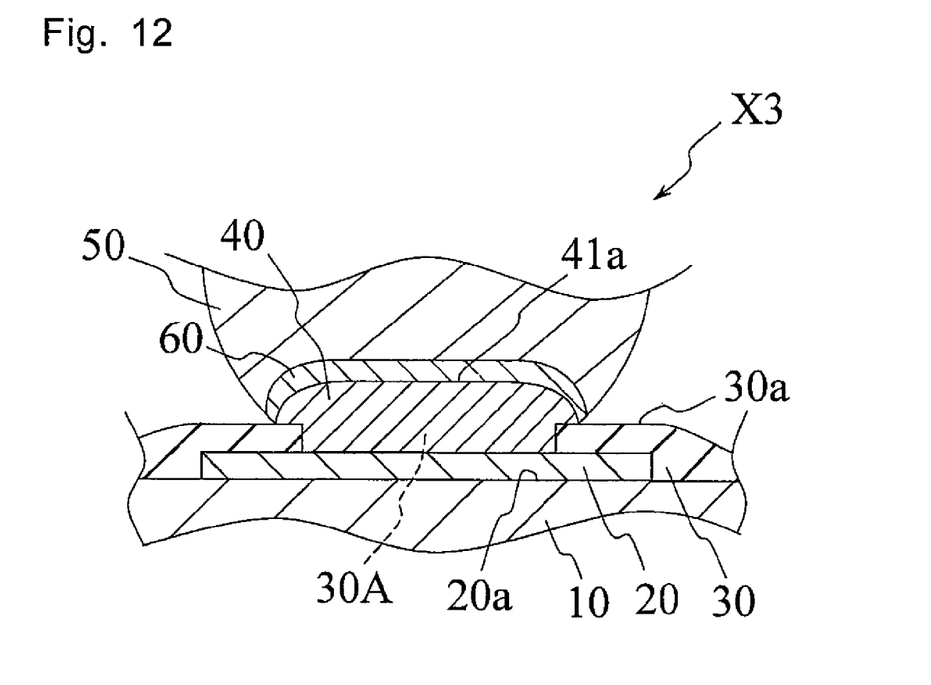
FIG. 12 is an enlarged sectional view of a key portion showing the schematic constitution of the semiconductor element manufactured by a manufacturing method according to a fourth embodiment of the present invention.

The method for manufacturing the semiconductor element X3 according to the fourth embodiment of the present invention comprises an organic coating forming step wherein the organic coating 70 is formed on the barrier metal layer 40, an electrically conductive member placing step wherein the solder paste P that has a melting point lower than the vaporization temperature of the organic coating 70 is placed on the organic coating 70, and a bump forming step where the solder paste P is melted and the organic coating 70 is evaporated so as to form the solder bump 50 on the barrier metal layer 40.

Therefore, according to the manufacturing method of the fourth embodiment, even after the solder paste P has been melted, the diffusion of, the component (such as nickel) that constitutes the barrier metal layer 40 into the solder paste P from the barrier metal layer 40 can be suppressed till the organic coating 70 has evaporated. Thus the manufacturing method of the fourth embodiment makes it possible to reduce the possibility of the relatively brittle intermetallic compound layer 60 (such as $(Cu, Ni)_6Sn_5$) being formed excessively thick at the interface between the barrier metal layer 40 and the solder bump 50. As a result, the manufacturing method of the fourth embodiment makes it possible to improve the reliability of the semiconductor element X3 that is manufactured.

FIG. 12 is an enlarged sectional view of a key portion showing the schematic constitution of the semiconductor element X3 manufactured by the method according to the fourth embodiment.

According to the manufacturing method of the fourth embodiment, since the organic coating 70 is formed on the barrier metal layer 40, even the oxidization of the barrier metal layer 40 that is formed solely from the electroless nickel plating layer can be suppressed without providing a gold layer as an anti-oxidizing layer on the electroless nickel plating layer formed as the barrier metal layer 40.

Further according to the manufacturing method of the fourth embodiment, since it is not necessary to provide a gold layer as the barrier metal layer 40, such a problem can be prevented from occurring as gold that constitutes the gold layer diffuses into the solder bump 50, resulting in deterioration of wettability of the solder bump 50.

According to this manufacturing method, it is preferable to completely vaporize the organic coating 70 provided on the barrier metal layer 40, whereby a decrease in the wettability of the solder paste P due to the undesirably remaing organic coating 70 can be suppressed.

According to this manufacturing method, since the organic coating 70 is formed to entirely cover the barrier metal layer 40, oxidization can be suppressed over the entire barrier metal layer 40, and therefore, a decrease in the wettability thereof relative to the solder paste P can be suppressed.

According to this manufacturing method, since the barrier metal layer 40 is formed also on the peripheral portion of the opening 30A of the passivation layer 30, it is possible to suppress corrosion or the like in the electrically conductive layer 20.

According to this manufacturing method, since the barrier metal layer 40 is formed by electroless nickel plating, the diffusion of the nickel component that forms the barrier metal layer 40 toward the solder bump 50 that is formed on the barrier metal layer 40 can be suppressed. Also because the barrier metal layer 40 contains phosphorus, it is possible to improve the corrosion resistance of the electroless nickel plating layer that forms the barrier metal layer 40.

In the semiconductor element X3 manufactured by the manufacturing method of the fourth embodiment, although there exists the intermetallic compound layer 60 between the solder bump 50 and the barrier metal layer 40, which is formed by the diffusion of the solder that constitutes the solder bump 50 and nickel that constitutes the barrier metal layer 40, the thickness of the intermetallic compound layer can be made smaller. Thus the thickness of the intermetallic compound layer 60 is not too large (for example, 4.0 μm or larger) and is sufficiently thin (for example, 2.0 μm or less) within a range that ensures proper contact. Also because it is made possible to suppress the layer from becoming locally thicker as is the case with the prior art, uniformity of the thickness is also improved. The intermetallic compound layer 60 may be formed from, for example, $(Cu, Ni)_6Sn_5$.

While the fourth embodiment of the present invention has been described above, the present invention is not limited thereto, and various modifications can be made without departing from the idea of the present invention.

For example, in the manufacturing method of the fourth embodiment, a volatile component of the organic coating 70 may be contained in the solder bump 50. Such a manufacturing method also achieves effects similar to those described above. In this case, when an alicyclic amine is contained as a volatile component of the organic coating 70, because N that forms the amine has the same functionality as that of a rosin flux, the same effects can be achieved as in the case of using a rosin flux.

The invention claimed is:

1. A semiconductor element comprising:
a substrate;
an electrically conductive layer on the substrate;
a protective layer having an opening on the electrically conductive layer;
a barrier metal layer in contact with the electrically conductive layer in the opening; and
an electrically conductive bump on the barrier metal layer,
the barrier metal layer containing phosphorus and having a phosphorus-rich portion that has a higher phosphorus content than a remaining portion has,
the phosphorus-rich portion being located in a surface region of the barrier metal layer facing the electrically conductive bump,
the thickness of the phosphorus-rich portion in the periphery of a region where the electrically conductive bump is formed being larger than at the center of the region where the electrically conductive bump is formed.

2. The semiconductor element according to claim 1, further comprising an intermetallic compound layer between the barrier metal layer and the solder bump, the intermetallic compound layer including components of the barrier metal layer and components of the electrically conductive layer, and wherein the remaining portion of the barrier metal layer other than the phosphorus-rich portion penetrates through the phosphorus-rich portion, so that the barrier metal layer is in contact with the intermetallic compound layer.

3. The semiconductor element according to claim 1, wherein the barrier metal layer extends over the protective layer along the periphery of the opening.

4. The semiconductor element according to claim 1, wherein:
the remaining portion of the barrier metal layer other than the phosphorus-rich portion comprises a first portion and a second portion each having a phosphorus content lower than that of the phosphorus-rich portion, and
the first portion has a phosphorus content lower than that of the second portion, and is located in a surface of the remaining portion facing the electrically conductive layer.

5. A mounting structure comprising:
a semiconductor element according to claim 1; and
a base member having a connection electrode, the base member also having a pad portion thereon that is electrically connected to the wiring electrode,
the pad portion being connected to the electrically conductive bump of the semiconductor element.

6. A semiconductor element comprising:
a substrate;
an electrically conductive layer on the substrate;
a protective layer having an opening on the electrically conductive layer;
a barrier metal layer in contact with the electrically conductive layer in the opening; and
an electrically conductive bump on the barrier metal layer,
the barrier metal layer containing phosphorus and having a phosphorus-rich portion that has a higher phosphorus content than the remaining portion has,
the phosphorus-rich portion being located in a surface region of the barrier metal layer facing the electrically conductive bump and also being located only in the periphery of a region where the electrically conductive bump is formed.

7. The semiconductor element according to claim 6, wherein the barrier metal layer extends over the protective layer along the periphery of the opening.

8. The semiconductor element according to claim 6, wherein:
the remaining portion of the barrier metal layer other than the phosphorus-rich portion comprises a first portion and a second portion each having a phosphorus content lower than that of the phosphorus-rich portion, and
the first portion has a phosphorus content lower than that of the second portion, and is located in a surface of the remaining portion facing the electrically conductive layer.

9. A mounting structure comprising:
a semiconductor element according to claim 6; and
a base member having a connection electrode, the base member also having a pad portion thereon that is electrically connected to the wiring electrode,
the pad portion being connected to the electrically conductive bump of the semiconductor element.

* * * * *